United States Patent
Pan et al.

(10) Patent No.: US 7,727,682 B2
(45) Date of Patent: Jun. 1, 2010

(54) SYSTEM AND METHOD FOR PROVIDING PHASE SHIFT MASK PASSIVATION LAYER

(75) Inventors: Hung-Ting Pan, Pingtung County (TW); Ken Wu, Hsinchu County (TW); Luke Hsu, Hsinchu (TW); Yao-Ching Ku, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 482 days.

(21) Appl. No.: 11/689,242

(22) Filed: Mar. 21, 2007

(65) Prior Publication Data

US 2008/0233486 A1 Sep. 25, 2008

(51) Int. Cl.
*G03F 1/00* (2006.01)

(52) U.S. Cl. ........................ 430/5; 250/492.2

(58) Field of Classification Search .............. 430/5, 430/321–324, 311; 250/492.2; 423/417, 423/418
See application file for complete search history.

(56) References Cited

U.S. PATENT DOCUMENTS

| 4,778,693 | A * | 10/1988 | Drozdowicz et al. | 427/584 |
| 5,686,206 | A * | 11/1997 | Baum et al. | 430/5 |
| 6,277,526 | B1 * | 8/2001 | Yang | 430/5 |
| 2005/0058912 | A1 * | 3/2005 | Lin et al. | 430/5 |
| 2005/0112476 | A1 * | 5/2005 | Bellman et al. | 430/5 |
| 2008/0044740 | A1 * | 2/2008 | Lin et al. | 430/5 |

* cited by examiner

*Primary Examiner*—Mark F Huff
*Assistant Examiner*—Stewart A Fraser
(74) *Attorney, Agent, or Firm*—Haynes and Boone, LLP

(57) ABSTRACT

System and method for providing a passivation layer for a phase shift mask ("PSM") are described. In one embodiment, a PSM comprises a transparent substrate; a phase shift pattern disposed on the transparent substrate; and a passivation layer disposed to substantially cover exposed surfaces of at least a portion of the phase shift pattern.

11 Claims, 2 Drawing Sheets

SYSTEM AND METHOD FOR PROVIDING PHASE SHIFT MASK PASSIVATION LAYER

BACKGROUND

Phase shift masks ("PSMs") used in photolithography processes typically comprise a transparent (e.g., quartz) substrate having a phase shift pattern formed thereon, the phase shift pattern comprising, for example, a molybdenum silicon (MoSi) film formed on the substrate.

With ever decreasing features sizes and increasing costs of current and future photolithographic masks, the repair of masks becomes a substantial factor of the total mask production cost. One method of repairing PSMs involves the deposition of tetra-ethyl-ortho-silicate, ("TEOS") on the area the be repairer and then reacting the TEOS to $SiO_2$ using an electric beam ("e-beam"). Although such a repair is initially effective, TEOS is easily removed during wet cleaning of the PSM using a solution of sulphuric acid ($H_2SO_4$) and ammonia ($H_3$), for example. As a result, such repairs are fairly temporary and must be made repeatedly over the life of the PSM.

BRIEF DESCRIPTION OF THE DRAWINGS

The features and advantages of a system and method for providing a PSM passivation layer in accordance with an embodiment will be more clearly understood from the following description taken in conjunction with the accompanying drawings in which like reference numerals designate similar or corresponding elements, regions, and portions, and in which.

DETAILED DESCRIPTION

Figure 1:
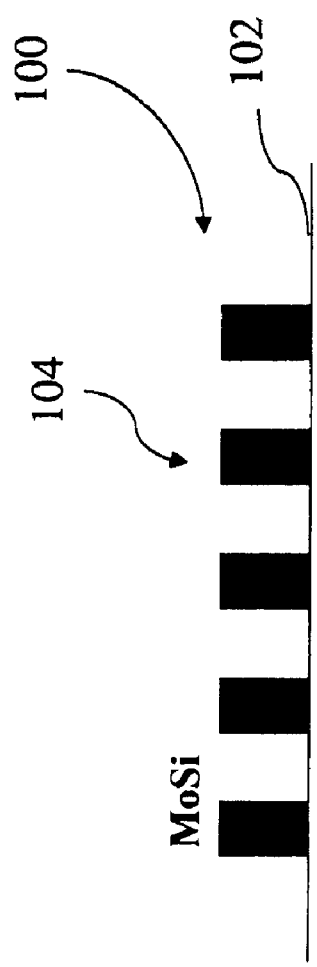
FIG. 1 illustrates a conventional PSM in which a technique of one embodiment may be practiced.

FIG. 1 illustrates a conventional PSM 100 in connection with which the embodiments described herein may be practiced. The PSM 100 comprises a transparent substrate 102 having disposed thereon a phase shift pattern 104. In one embodiment, the substrate 102 comprises quartz and the phase shift pattern 104 comprises MoSi film. The optical characteristics of MoSi are a phase shift ("$\Delta\phi$") of 180° and a transmittance ("T") of 6%.

Figure 2:
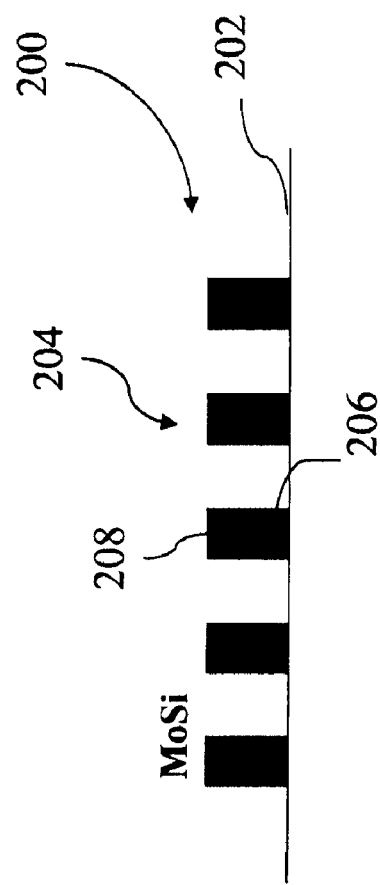
FIG. 2 illustrates a conventional PSM repaired using TEOS deposition in which a technique of one embodiment may be practiced.

FIG. 2 illustrates a PSM 200 which is similar to the PSM 100 in that it comprises a transparent substrate 202 having a phase shift pattern 204 formed thereon. As with the PSM 100, in one embodiment, the substrate 202 comprises quartz and the phase shift pattern 204 comprises MoSi film. A defect in a feature 206 off the phase shift pattern 204 has been repaired by depositing TEOS 208 thereon and applying an e-beam thereto to react the TEOS 208 to $SiO_2$.

Figure 3:
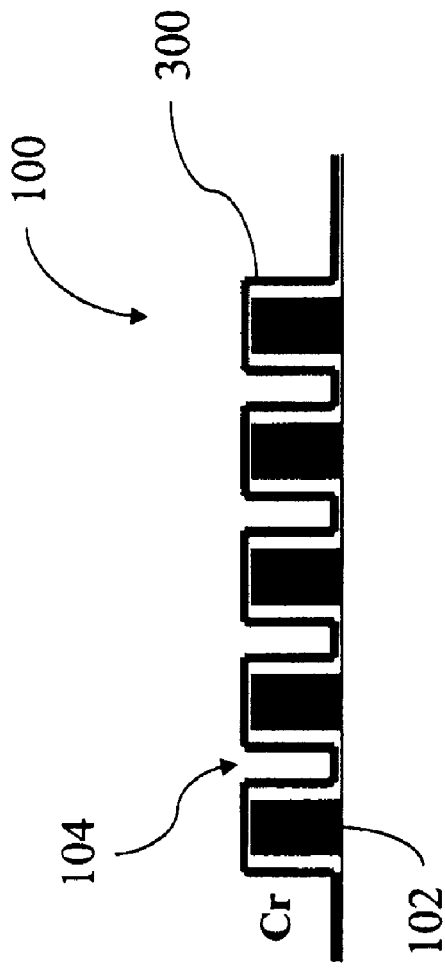
FIG. 3 illustrates the PSM of FIG. 1 after a passivation layer has been deposited thereon in accordance with one embodiment.

FIG. 3 illustrates a technique of one embodiment as applied to the PSM 100 of FIG. 1. As shown in FIG. 3, a passivation layer 300 is deposited on all surfaces of the PSM 100, including both the substrate 102 and the phase shift pattern 104, thereby to protect the MoSi film during cleaning thereof. In one embodiment, the passivation layer 300 comprises a Cr film, which fits the optical characteristics of MoSi, such that the expected phase shift and attenuation can be achieved. Specifically, $Cr(CO)_6$ is applied to the PSM 100 and reacted to Cr by e-beam. The passivation layer 300 enables the clean cycle time of the PSM 100 to be increased.

Figure 4:
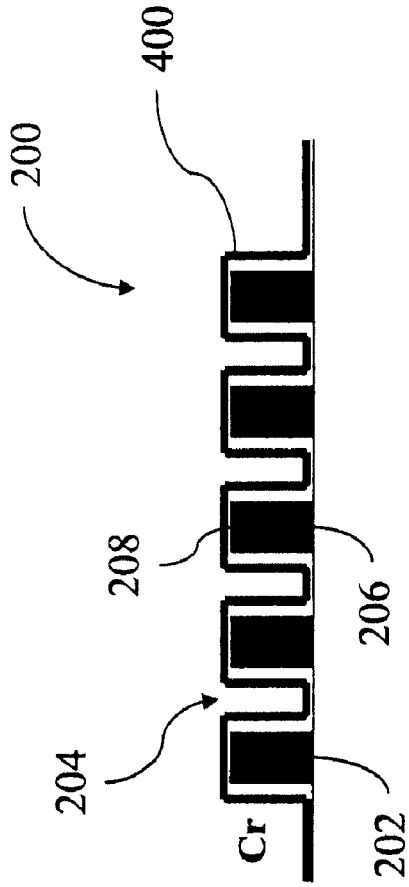
FIG. 4 illustrates the PSM of FIG. 2 after a passivation layer has been deposited thereon in accordance with one embodiment.

FIG. 4 illustrates a technique of one embodiment as applied to the PSM 200 of FIG. 2. As shown in FIG. 4, a passivation layer 400 is deposited on all surfaces of the PSM 200, including both the substrate 202 and the phase shift pattern 204, thereby to protect the MoSi film during cleaning thereof. The passivation layer 400 also covers the TEOS 208 used to repair the defect in the feature 206, which has been reacted to $SiO_2$ via e-beam. In one embodiment, the passivation layer 400 comprises a Cr film. Specifically, $Cr(CO)_6$ is applied to the PSM 100 and reacted to Cr by e-beam. The Cr film functions as an "absorber," with its high absorption coefficient and small phase shift, while the TEOS 208 functions as a "phase-shifter", with a total absorption of less than 20%. As a result, the combination of Cr and TEOS fits the optical characteristics of MoSi, such that the expected phase shift and attenuation can be achieved. Again, the addition of the passivation layer 400 enables the clean cycle time in the PSM 400 to be increased.

One embodiment is a phase shift mask ("PSM") comprising a transparent substrate, a phase shift pattern disposed on the transparent substrate, and a passivation layer disposed to substantially cover exposed surfaces of at least a portion of the phase shift pattern.

Another embodiment is a method of repairing a phase shift mask ("PSM") comprising a transparent substrate having a phase shift pattern formed thereon. The method comprises depositing tetra-ethyl-ortho-silicate ("TEOS") on at least a portion of the phase shift pattern, thereby to repair a defect in the at least a portion of the phase shift pattern, and depositing a passivation layer substantially covering exposed surfaces of the at least a portion of the phase shift pattern.

Yet another embodiment is a method of fabricating a phase shift mask ("PSM"). The method comprises forming a plurality of phase shift features on a transparent substrate, and forming a passivation layer substantially covering exposed surfaces of the plurality of phase shift features.

Some, although not all, embodiments may enjoy certain advantages over the prior art. Such exemplary advantages include, but are not limited to (1) the use of a multiple layer structure that matches the phase and transmittance of MoSi or any specific phase and transmittance needed for a particular process, and (2) the use of a high-resistance material as the top layer, thereby to enhance the cleaning durability of the mask.

While the preceding description shows and describes one or more embodiments, it will be understood by those skilled in the art that various changes in form and detail may be made therein without departing from the spirit and scope of the present disclosure. Therefore, the claims should be interpreted in a broad manner, consistent with the present disclosure.

What is claimed is:

1. A method of repairing a phase shift mask ("PSM") comprising a transparent substrate having a phase shift pattern formed thereon, the method comprising:

depositing tetra-ethyl-ortho-silicate ("TEOS") on at least a portion of the phase shift pattern, thereby to repair a defect in the at least a portion of the phase shift pattern; and forming a passivation layer substantially covering exposed surfaces of the at least a portion of the phase shift pattern; wherein the forming a passivation layer comprises:

applying $Cr(CO)_6$ to the PSM; and reacting the $Cr(CO)_6$ to Cr by e-beam.

2. The method of claim 1 wherein the phase shift pattern comprises a plurality of phase shift features.

3. The method of claim 2 wherein at least one of the phase shift features comprises molybdenum silicon (MoSi).

4. The method of claim 2 wherein at least one of the phase shift features comprises tetra-ethyl-ortho-silicate ("TEOS").

5. The method of claim 2 wherein at least one of the phase shift features comprises a combination of MoSi and TEOS.

6. The method of claim 1 wherein the passivation layer combined with the TEOS on the at least a portion of the phase shift pattern collectively achieve a phase shift of approximately 180°.

7. The method of claim 1 wherein the passivation layer combined with the TEOS on the at least a portion of the phase shift pattern collectively achieve a transmittance of approximately 6%.

8. The method of claim 1 wherein the transparent substrate comprises quartz.

9. A method of fabricating a phase shift mask ("PSM"), the method comprising:

forming a plurality of phase shift features on a transparent substrate; and forming a passivation layer substantially covering exposed surfaces of the plurality of phase shift features, the forming a passivation layer comprising:

applying $Cr(CO)_6$ to the PSM; and reacting the $Cr(CO)_6$ to Cr by e-beam.

10. The method of claim 2 wherein at least one of the phase shift features comprises molybdenum silicon (MoSi).

11. The method of claim 1 wherein the transparent substrate comprises quartz.

* * * * *